United States Patent
Matsuzaki

[11] Patent Number: 5,946,199
[45] Date of Patent: Aug. 31, 1999

[54] SHIELDING CASE

[75] Inventor: Satoru Matsuzaki, Fukushima-ken, Japan

[73] Assignee: Alps Electric Co., Ltd., Tokyo, Japan

[21] Appl. No.: 08/980,517

[22] Filed: Dec. 1, 1997

[30] Foreign Application Priority Data

Dec. 2, 1996 [JP] Japan ................................. 8-321585

[51] Int. Cl.⁶ .................................................. H05K 9/00
[52] U.S. Cl. .......................... 361/818; 361/752; 361/801; 361/816; 174/35 R
[58] Field of Search .................................. 361/752–753, 361/800–802, 813–818; 334/85; 330/68; 174/35 R, 35 GC; 439/620, 607

[56] References Cited

FOREIGN PATENT DOCUMENTS 08293687  11/1996  Japan .

*Primary Examiner*—Leo P. Picard
*Assistant Examiner*—Phuong T. Vu
*Attorney, Agent, or Firm*—Brinks Hofer Gilson & Lione

[57] ABSTRACT

A shielding case ensures no deterioration in shielding effect, and allows a printed circuit board (PCB) to be installed from under the frame thereof and a leader terminal to be also installed from above the opening thereof. The shielding case is provided with: a top cover (26) and a bottom cover (27) which are fitted to a top edge portion (24) and a bottom edge portion (25), respectively, of a frame (23) to cover open sections (21) and (22) of the frame (23); a PCB (31) which is housed and installed in a cabinet (28) constituted by the frame (23), the top cover (26), and the bottom cover (27), and inserting holes (30); where the top portion of one side surface of the frame (23) is bent inward to provide the side surface of the frame (23) with a horizontal plate portion (32), and an opening (33) is formed in the horizontal plate section (32), the opening (33) is covered from inside by an edge portion of the PCB (31), the inserting holes (30) of the PCB (31) are exposed through the opening (33), and molded base terminals (29) are inserted in the inserting holes (30) and soldered so as to secure them to the PCB (31).

3 Claims, 2 Drawing Sheets

SHIELDING CASE

BACKGROUND OF THE INVENTION

1. Field of the Invention

The present invention relates to a shielding case from which a leader terminal is led out from a printed circuit board in a cabinet of high-frequency equipment such as a television tuner.

2. Description of Related Art

In a television broadcast receiving tuner, a circuit board on which circuit components have been mounted is housed in a cabinet, namely, a shielding case, constituted primarily by a frame, a top cover, and a bottom cover in order to shut out unwanted signals coming from outside and to prevent internal signals from leaking out.

FIG. 4 is a schematic representation illustrating a conventional shielding case.

FIG. 4 shows an example of the shielding case for a BS tuner, which shielding case is provided with: a square frame 3 which constitutes the peripheral side surface of the shielding case to compose open sections 1 and 2 which leave the top and bottom of the shielding case open; a top cover 6 and a bottom cover 7 which are fitted to the top and bottom edge sections 4 and 5 of the frame 3 and which respectively cover the open sections 1 and 2 of the frame 3; and a printed circuit board (hereinafter referred to as "PCB") 11 which is housed and installed in a space formed by a cabinet 8 composed by the frame 3, the top cover 6, and the bottom cover 7 and which is provided with inserting holes 10 in which molded base terminals 9 are inserted.

Such molded base terminals 9 are leader terminals; they may be, for example, metal terminals. The molded base terminals 9 or the metal terminals are employed to replace feed-through capacitors, which are high-frequency components. As illustrated in FIG. 4, when the molded base terminals (or the metal terminals) 9 are used, a side surface of the frame 3 is provided with an opening 12 through which the molded base terminals 9 are led out of the cabinet 8. The molded base terminals 9 are composed of metal terminals made integral with insulators 13 by insert or outsert molding.

Reference numeral 14 denotes an electronic component mounted on the PCB 11; reference numeral 15 denotes a PCB mounting plate formed on the frame by bending it; and reference numeral 16 denotes a PCB insert piece projecting from the bottom of the PCB mounting plate.

In the aforesaid prior art, however, since the molded base terminals 9 are led out through the opening 12 formed in the cabinet 8 (the frame 3), the opening 12 has been responsible for deteriorated shielding effect because the opening 12 is formed by eliminating the frame by a width L according to the number of the molded base terminals 9 installed. Hence, providing many molded base terminals 9 inevitably adds to the size of the opening 12 with resultant marked deterioration in the shielding effect.

At the time of assembly, the PCB 11 with the molded base terminals 9 fixed thereto by soldering is placed and installed in the frame through the top open section 1 or the bottom open section 2; since the distal ends of the molded base terminals 9 jut out from the left end of the PCB 11, the PCB 11 must be tilted to set it in the frame 3 such that the distal ends of the molded base terminals 9 are inserted in the opening 12 of the frame. This has been requiring complicated installing operation, making it difficult to achieve automated assembly.

SUMMARY OF THE INVENTION

Accordingly, it is an object of the present invention to provide a shielding case which allows a leader terminal to be connected to a PCB in a cabinet, which does not adversely affect the shielding effect, and which permits the PCB to be readily installed from below a frame and the leader terminal to be readily installed from above an opening, thus making it easily to achieve automated assembly.

It is another object of the present invention to provide a shielding case which permits many leader terminals to be installed without sacrificing the strength of the frame even when the opening is made larger to accommodate more leader terminals.

To this end, according to the present invention, there is provided a shielding case provided with: a frame constituting a peripheral side surface of the shielding case such that it leaves the top and bottom of the shielding case open; a top cover and a bottom cover which are respectively fitted onto the top edge and the bottom edge of the frame and which respectively cover the top and bottom open sections of the frame; and a PCB which is housed and installed in a space formed by the frame, the top cover, and the bottom cover and which is provided with an inserting hole in an edge portion thereof through which a leader terminal is inserted for connection; wherein the top portion of one side surface of the frame is bent inward to provide the side surface of the frame with a horizontal plate portion, the horizontal plate portion is provided with an opening which is covered from inside by an edge portion of the PCB, the inserting hole is exposed through the opening, and the leader terminal is inserted in the inserting hole and soldered so as to secure it to the PCB.

In a preferred from of the present invention, the foregoing frame is formed into a square shape, and the foregoing opening is formed over the full width of the frame.

In another preferred form of the present invention, the aforesaid opening is provided with a reinforcing bar.

DESCRIPTION OF THE PREFERRED EMBODIMENTS

An embodiment of the present invention will now be explained.

Figure 1:
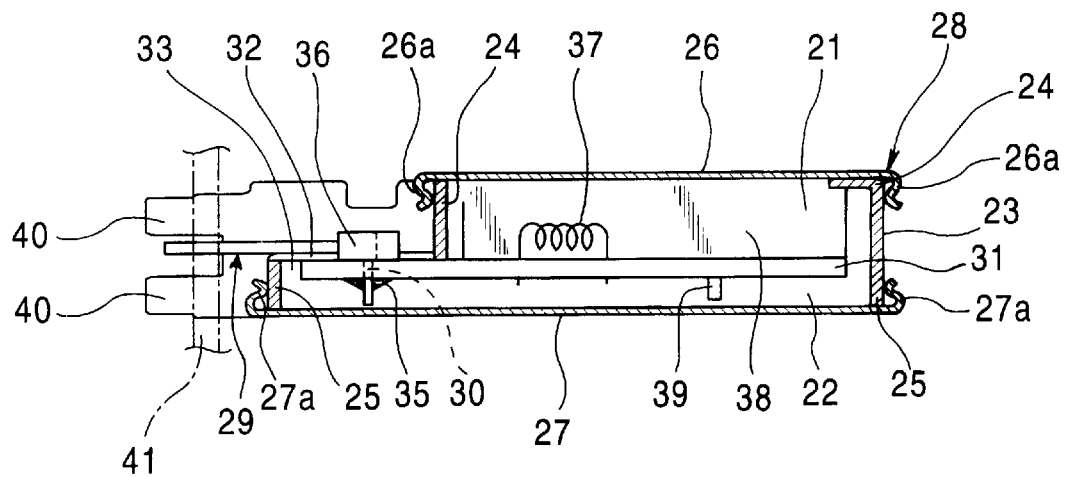
FIG. 1 is a longitudinal sectional view illustrating an embodiment of a shielding case in accordance with the present invention.
Figure 2:
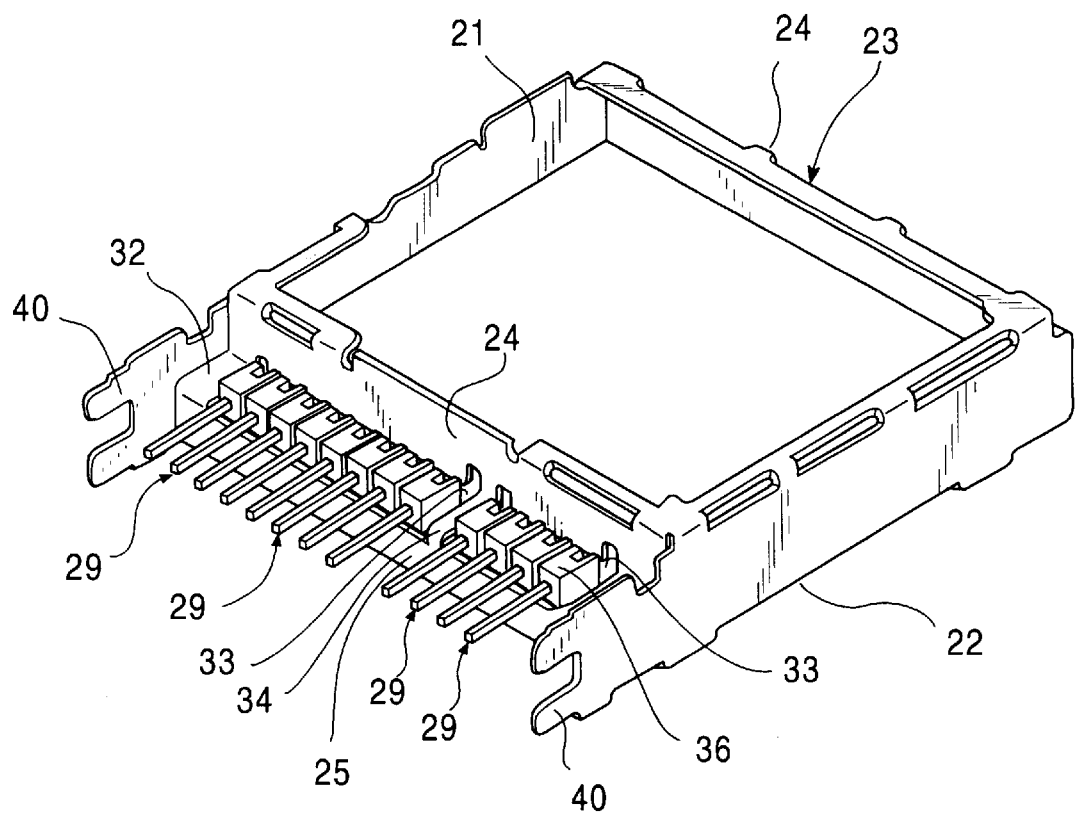
FIG. 2 is a perspective view of an essential section illustrative of a leader terminal disposed at the opening of the shielding case shown in FIG. 1.

FIG. 1 is a longitudinal sectional view illustrating an embodiment of a shielding case in accordance with the present invention; FIG. 2 is a perspective view of an essential section illustrative of a leader terminal disposed at the opening of the shielding case shown in FIG. 1; and FIG. 3 is a perspective view of an essential section illustrating an enlarged view of the opening of the shielding case shown in FIG. 1.

As shown in these drawings, the shielding case of a BS tuner or the like is provided with: a square frame 23 which constitutes the peripheral side surface of the shielding case to form a top open section 21 and a bottom open section 22; a top cover 26 and a bottom cover 27 which are fitted onto top and bottom edge portions 24 and 25 of the frame 23 to respectively cover the open sections 21 and 22; and a PCB 31 which is housed and installed in a space formed by a cabinet 28 composed of the frame 23, the top cover 26, and the bottom cover 27 and which is provided with inserting holes 30 in which molded base terminals 29 are inserted.

The top portion, namely, the top edge portion 24, of one side surface of the frame 23 is bent inward to provide a horizontal plate section 32 on the side surface of the frame 23. As illustrated in FIG. 3, an opening 33 is formed in the horizontal plate section 32 over the full width of the frame 23, and a reinforcing bar 34 is integrally formed at about the middle of the opening 33. Hence, in this embodiment, the opening 33 is divided into two portions by the bar 34. Alternatively, a plurality of bars 34 may be provided.

Figure 3:
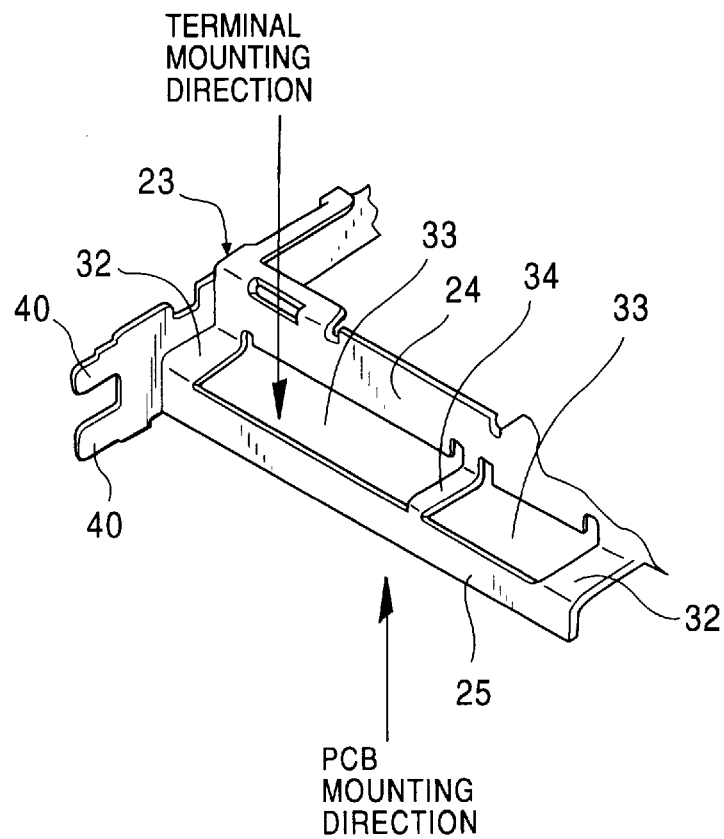
FIG. 3 is a perspective view of an essential section illustrating an enlarged view of the opening of the shielding case shown in FIG. 1.
Figure 4:
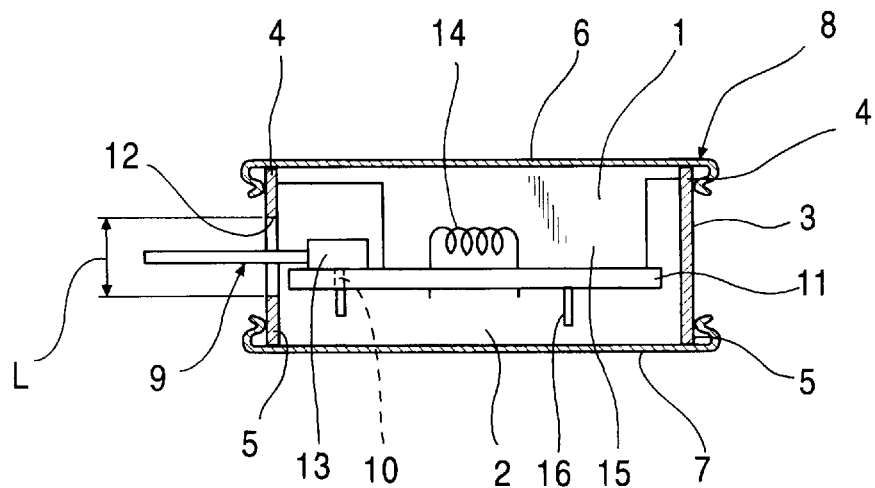
FIG. 4 is a schematic representation showing a conventional shielding case.

As illustrated in FIG. 3, the PCB 31 in the cabinet 28 is installed from under the frame 23 so that it covers the opening 33 from inside by an edge portion thereof. Thus, the edge portion of the PCB 31 is exposed through the opening 33, and the exposed portion of the PCB 31 is provided with the inserting holes 30 in which the molded base terminals 29 are inserted.

Hence, from above the frame 23 (the cabinet 28), the molded base terminals 29 are inserted in the inserting holes 30 of the PCB 31 exposed through the opening 33 and attached with solder 35 so as to secure the molded base terminals 29 to the PCB 31 as shown in FIG. 1.

A plurality of the molded base terminals 29 are disposed at the opening 33 as shown in FIG. 2. The molded base terminals 29 may be discrete or may be formed integrally by insert- or outsert-molding insulators 36.

As set forth above, the top cover 26 and the bottom cover 27 are fitted to the top edge portion 24 and the bottom edge portion 25, respectively, to cover the open sections 21 and 22; however, the top and bottom edge portions 24 and 25 allow the areas where engaging hooks 26a and 27a of the top cover 26 and the bottom cover 27, respectively, are engaged as shown in FIG. 1.

The shielding case assembly further includes an electronic component 37 mounted on the PCB 31, a shield 38 formed on the frame by bending; a PCB inserting piece 39 projecting from the bottom edge of the shield 38; frame legs 40 formed on the frame 23; and a board 41 on which the frame legs 40 are inserted and fixed to secure the molded case, namely, the tuner.

The procedure for assembling the foregoing embodiment will now be described. First, the PCB 31 having the electronic component 37 mounted on is put into the frame 23 from under the frame 23 as shown by the arrow in FIG. 3 and it is installed therein, then the opening 33 is covered from inside by an edge portion of the PCB 31 as shown in FIG. 1. At this time, the PCB 31 can be positioned without slanting it, that is, it can be moved into the frame 23 while holding it horizontal in relation to the frame 23. After that, as indicated by the arrow in FIG. 3, the molded base terminals 29 are inserted from above the frame 23 into the inserting holes 30 of the PCB 31 which are exposed to the opening 33 and secured by soldering them. Then, the top cover 26 and the bottom cover 27 are fitted to the top and bottom edge portions 24 and 25, respectively, of the frame 23 to cover the open sections 21 and 22, thus completing the molded case shown in FIG. 1.

In the embodiment set forth above, the shielding case is provided with: the frame 23 constituting the peripheral side surface of the shielding case such that it leaves the top and bottom thereof open; the top cover 26 and the bottom cover 27 which are respectively fitted onto the top edge portion 24 and the bottom edge portion 25 of the frame 23 and which respectively cover the top and bottom open sections 21 and 22 of the frame 23; and the PCB 31 which is housed and installed in the space formed by the cabinet 28 constituted by the frame 23, the top cover 26, and the bottom cover 27 and which is provided with the inserting holes 30 in which the molded base terminals 29 are inserted; wherein the top portion (the top edge portion 24) of one side surface of the frame 23 is bent inward to provide the side surface of the frame 23 with the horizontal plate portion 32, and the opening 33 is formed in the horizontal plate portion 32, the opening 33 is covered from inside by the edge portion of the PCB 31, the inserting holes 30 of the PCB 31 are exposed through the opening 33, and the molded base terminals 29 are inserted in the inserting holes 30 and soldered so as to secure the PCB 31; and the frame 23 is formed into the square frame and the opening 33 is formed over the full width of the frame 23, and the opening 33 of the frame 23 through which the molded base terminals 29 are inserted is covered by the edge portion of the PCB 31. This enables the molded base terminals 29 to be connected to the PCB 31 in the cabinet 28 without deteriorating the shielding effect. Further, since one side surface of the frame 23 is provided with the horizontal plate section 32 where the opening 33 is formed, the PCB 31 can be installed easily from under the frame 23 and the molded base terminals 29 can be also easily installed from above the opening 33, thus permitting automated assembly to be achieved readily.

Moreover, in the embodiment set forth above, the opening 33 is provided with the reinforcing bar 34; hence, the strength of the frame 23 will not be deteriorated even if the opening 33 is made longer, allowing many molded base terminals 29 to be installed.

The molded base terminals 29 are leader terminals; they may alternatively be, for example, metal terminals as in the conventional example.

In the embodiment explained above, the terms "top" cover, "bottom" cover, or the "top" of the side surface of the frame 23 has been used merely for the purpose of convenience; the present invention will not be affected even if the top cover and the bottom cover are reversed, and/or the top of the side surface of the frame is replaced by the bottom.

Thus, according to the present invention, the opening of the frame through which the leader terminals are inserted is covered by the edge portion of the PCB thereby to enable the connection of the leader terminals to the PCB in the cabinet without adversely affecting the shielding effect. Moreover, since the opening is formed in the horizontal plate section provided on the side surface of the frame, the PCB can be readily installed from under the frame, and the leader terminals can be readily installed from above the opening, thus making it possible to achieve automated assembly easily.

In addition, since the opening is provided with the reinforcing bar, many leader terminals can be installed without adversely affecting the strength of the frame even if the opening is made longer.

What is claimed is:

1. A shielding case comprising:
   a frame constituting the peripheral side surface of said shielding case such that it leaves the top and bottom thereof open;
   a top cover and a bottom cover which are respectively fitted onto the top edge and the bottom edge of said frame and which respectively cover the top and bottom open sections of said frame; and a printed circuit board which is housed and installed in a space formed by said frame, said top cover, and said bottom cover, and an edge portion of which is provided with an inserting hole through which a leader terminal is connected;

wherein the top portion of one side surface of said frame is bent inward to provide the side surface of said frame with a horizontal plate portion, and an opening is formed in said horizontal plate portion; and said opening is covered from inside by an edge portion of said printed circuit board, and said inserting hole is exposed through said opening to insert said leader terminal in said inserting hole and solder it so as to secure it to said printed circuit board.

2. A shielding case according to claim 1, wherein said frame is formed into square shape, and said opening is formed over the full width of said frame.

3. A shielding case according to claim 1, wherein said opening is provided with reinforcing bar.

* * * * *